United States Patent [19]
Haji et al.

[11] Patent Number: 5,676,856
[45] Date of Patent: Oct. 14, 1997

[54] ELECTRIC DISCHARGE APPARATUS FOR CLEANING ELECTRODE ON WORKPIECE AND METHOD THEREOF

[75] Inventors: Hiroshi Haji, Chikushino; Isamu Morisako, Fukuoka, both of Japan

[73] Assignee: Matsushita Electric Industrial Co., Ltd., Osaka, Japan

[21] Appl. No.: 427,218

[22] Filed: Apr. 24, 1995

[30] Foreign Application Priority Data

| Apr. 25, 1994 | [JP] | Japan | 6-086666 |
| Aug. 15, 1994 | [JP] | Japan | 6-191407 |
| Aug. 17, 1994 | [JP] | Japan | 6-193045 |

[51] Int. Cl.$^6$ .................................. B23K 20/00
[52] U.S. Cl. .......................... 219/56.21; 219/56.22
[58] Field of Search .................. 219/137 R, 123, 219/137.41, 56.21, 56.22, 75

[56] References Cited

U.S. PATENT DOCUMENTS

| 2,906,857 | 9/1959 | Nestor | 219/75 |
| 3,248,514 | 4/1966 | Ramsey | 219/137 R |
| 3,352,997 | 11/1967 | Butler | 219/123 |
| 3,980,860 | 9/1976 | Howell et al. | 219/137.41 |
| 4,434,348 | 2/1984 | Reid | 219/75 |
| 4,572,772 | 2/1986 | Peterson | 219/56.22 |

FOREIGN PATENT DOCUMENTS

| 59-133982 | 8/1984 | Japan | 219/137 R |
| 4-123430A | 4/1992 | Japan . | |
| 2035173 | 6/1980 | United Kingdom | 219/137.41 |

*Primary Examiner*—Clifford C. Shaw

[57] ABSTRACT

A voltage is applied between a first cleaning electrode that in contact with an electrode on a workpiece such as a printed circuit board or a chip, and a second cleaning electrode located in the vicinity of the electrode on the workpiece, from a voltage application circuit so as to produce an electric discharge on the electrode on the workpiece, whereby contamination sticking to the electrode on the workpiece is locally removed by heat generated from the electric discharge.

3 Claims, 9 Drawing Sheets

ELECTRIC DISCHARGE APPARATUS FOR CLEANING ELECTRODE ON WORKPIECE AND METHOD THEREOF

BACKGROUND OF THE INVENTION

The present invention relates to a cleaning apparatus for, and a cleaning method of, removing contamination from the outer surface of an electrode on a printed circuit board or a lead frame or on a chip such as a semiconductor device mounted on the printed circuit board or a lead frame. Further, the present invention relates to a wire bonding apparatus having a cleaning function, and to a wire bonding method.

RELATED ART

Contamination such as organic substance (for example, phenol or epoxy) at the outer surface of an electrode on a workpiece such as a substrate or a chip possibly causes inferior wire bonding in a wire-bonding process of connecting an electrode on a printed circuit board with an electrode on a chip mounted on the printed circuit board. Accordingly, the applicant has proposed a plasma cleaning apparatus for cleaning an electrode on a printed circuit board or an electrode on a chip prior to wire-bonding in Japanese Laid-Open Patent No. 4-123430.

The plasma cleaning apparatus disclosed in the Japanese Laid-Open Patent No. 4-123430 generates plasma in a casing in which a circuit board mounted thereon with chips is stored, so as to allow ions to impinge upon the outer surface of the electrode in order to remove contamination from an object to be cleaned. This cleaning apparatus can offer such an advantage that several printed circuit boards can be cleaned with a high workability.

However, the above-mentioned plasma cleaning apparatus has also presented a problem that the outer surface of a circuit board and the outer surfaces of components such as chips, other than electrodes, are possibly damaged since ions impinge upon the printed circuit board and the chips over their entire surfaces. Further, this plasma cleaning apparatus has a relatively large size so as to require a large installation space, and has been highly expensive.

SUMMARY OF THE INVENTION

The present invention is devised in view of the above-mentioned problems inherent to the prior art, and accordingly, a first object of the present invention is to provide a cleaning method and apparatus which can locally and simply clean only an object to be cleaned, such as an electrode on a printed circuit board or a chip.

Further, a second object of the present invention is to provide a wire-bonding apparatus and a wire-bonding method, having such a function that the outer surface of an electrode can be cleaned.

To this end, according to the present invention, there is provided an apparatus for cleaning an electrode on a workpiece comprising means for positioning the workpiece, a first cleaning electrode which can approach the electrode on the workpiece, a second cleaning electrode that can also approach the electrode on the workpiece, with which the first cleaning electrode makes contact, and a voltage application circuit for applying a voltage between the first and second cleaning electrodes so as to generate electric discharge between the first and second cleaning electrodes in order to remove contamination on the outer surface of the electrode by using heat generated by this electric discharge.

Further, according to the present invention, there is provided a wire-bonding apparatus comprising cleaning means generating electric discharge along an electrode on a workpiece, for removing contamination on the electrode by using the electric discharge, and wire-bonding means for connecting a wire to the thus cleaned electrode on the workpiece.

With the above-mentioned apparatus for cleaning an electrode on a workpiece, contamination can be locally removed from the electrode on the workpiece by heat given by electric discharge generated along the electrode on the workpiece.

Further, with the above-mentioned wire-bonding apparatus, a wire is connected to an electrode on a workpiece after contamination is removed therefrom.

The present invention will be hereinbelow described in detail with reference to the drawings in which:

DETAILED DESCRIPTION OF PREFERRED EMBODIMENTS

Figure 1:
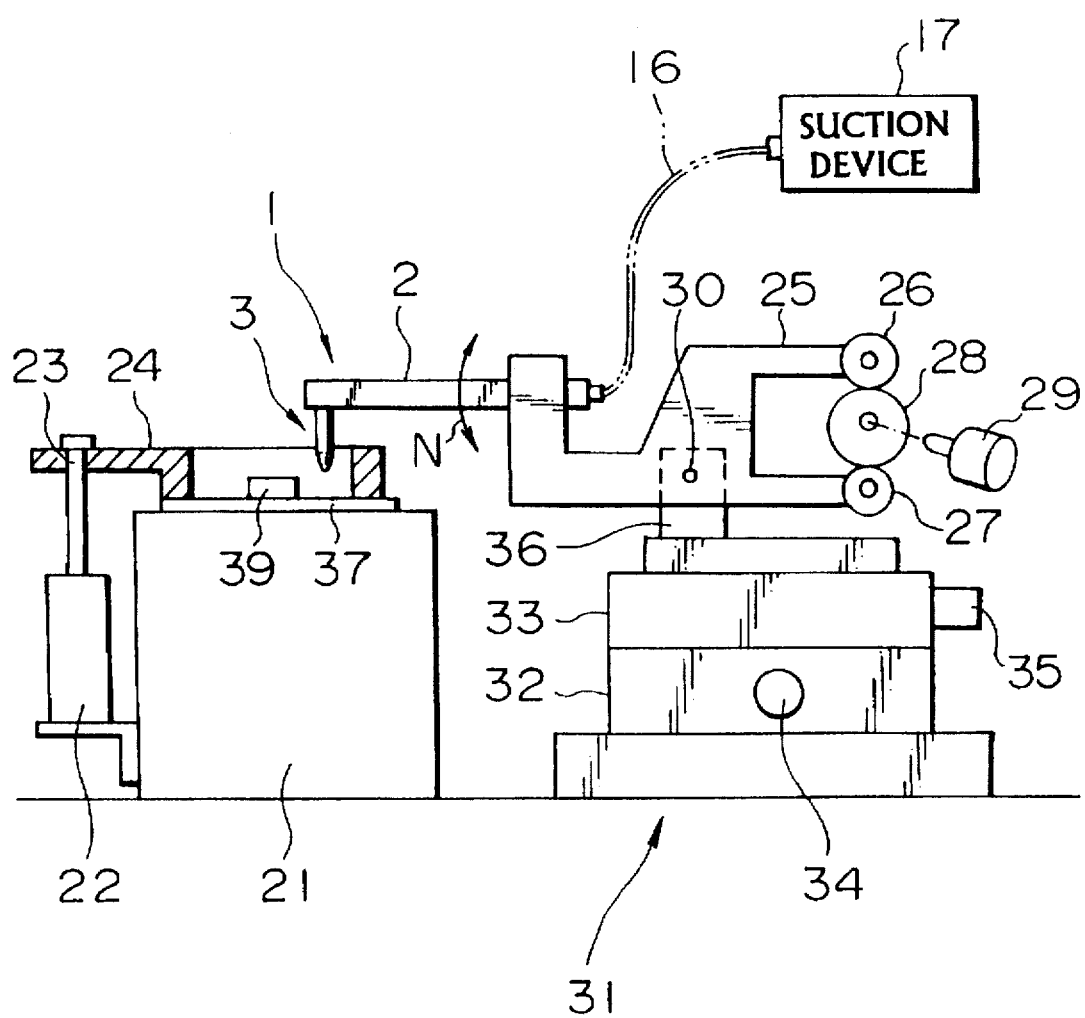
FIG. 1 is a side view illustrating an apparatus for cleaning an electrode on a workpiece in a first embodiment of the present invention.

Referring to FIG. 1, a cleaning unit 1 comprises an arm 2, and a cleaning tool 3 carried by the arm 2. The structure of the cleaning unit 1 will be hereinbelow described in detail with reference to FIG. 2.

The arm 2 is made of electroconductive materials such as copper or iron. The cleaning tool 3 is composed of first and second cleaning electrodes 4, 5. The first cleaning electrode 4 is hollow so as to have a downward elongated cylindrical shape, being made of an insulating material such as ceramic, and being coated over its outer surface and its lower surface with an electroconductive film 6 (refer to FIG. 3). This electroconductive film is formed of, for example, nickel plating.

Figure 2:
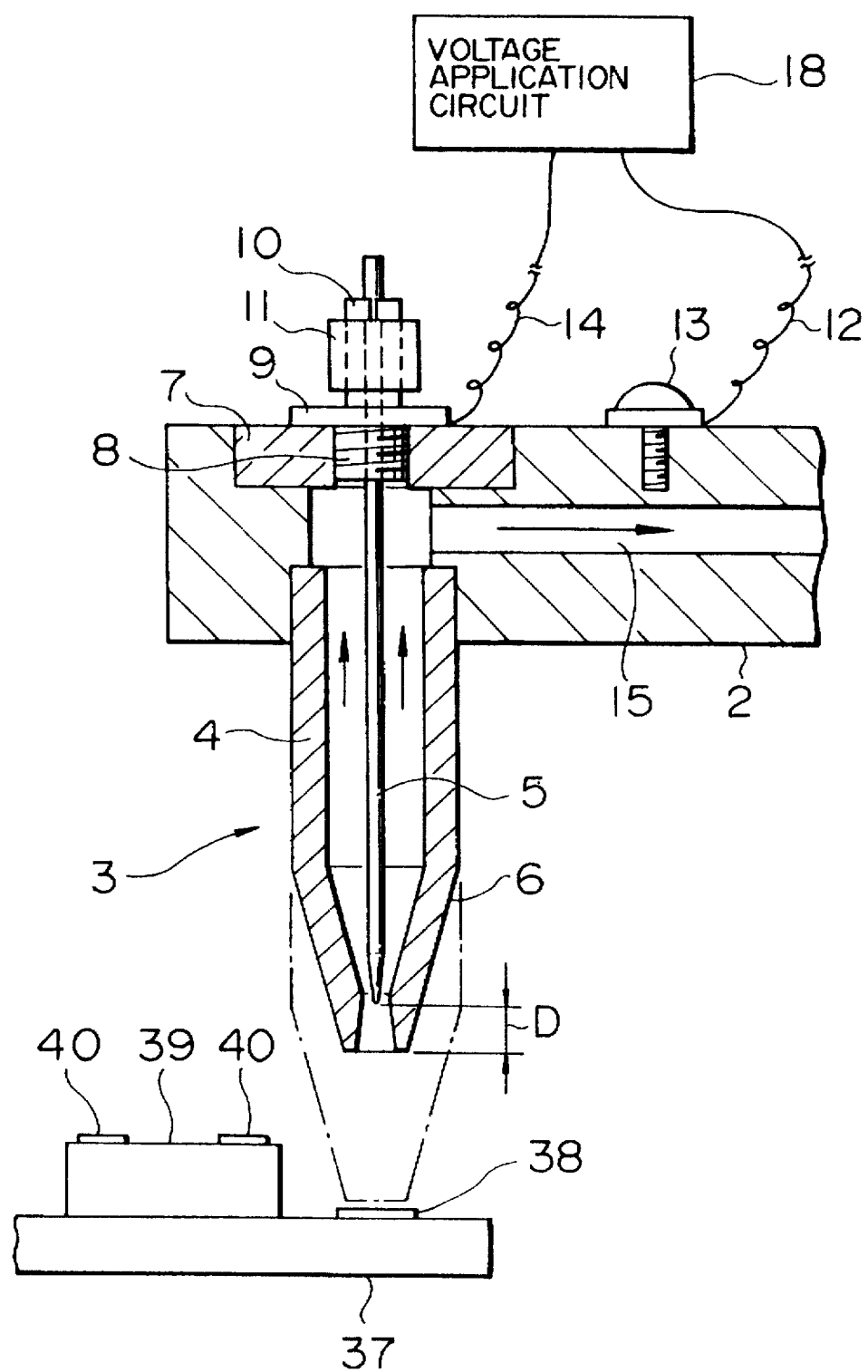
FIG. 2 is a partial sectional view illustrating the cleaning apparatus shown in FIG. 1.

Referring to FIG. 2, the first cleaning electrode 4 is carried by the front end part of the arm 2. The second cleaning electrode 5 is a pin-like shape and is vertically laid in the first cleaning electrode 4, having its lower end part which is formed in a sharp needle-like shape. The second cleaning electrode 5 is made of tungsten or the like. The lower ends of the first and second electrodes are separated from each other by a distance D. With this arrangement in which the second cleaning electrode 5 is stored in the first cleaning electrode 4, the cleaning tool 3 can have a compact structure.

An insulator 7 is mounted on the upper surface of the front end part of the arm 2. Further, an electroconductive screw 8 is fastened in the insulator 7. A washer 9 is located on the upper surface of the insulator 7. The second cleaning electrode 5 pierces through the screw 8 and the washer 9, having its upper end part held in a bi-split holder 10 which is gripped by a ring 11. The external shape of the holder 11 is downward tapered, and accordingly, if the ring 11 is pushed up, the holder 10 is inward clamped so as to surely hold the second cleaning electrode 5. On the contrary if the ring 11 is pushed down, the holder is outwardly loosened so that the second cleaning electrode 5 is released from its held condition. Accordingly, by moving the second cleaning electrode 5 up and down, the above-mentioned distance D can be adjusted so as to be optimum for electric discharge.

The arm 2 is connected thereto with a first lead wire 12 which is retained by a screw 13. A second lead wire 14 is connected between the washer 9 and the insulator 7. Further, the first and second lead wires 12, 14 are connected to a voltage application circuit 18. The electroconductive film 16 on the first cleaning electrode 4 makes contact with the arm, and accordingly, when a voltage is applied from the voltage application circuit 18, the voltage is also applied to the electroconductive film 16. When the voltage is applied to the washer 9 and the screw 8 through the second lead wire 14, the voltage is also applied to the second cleaning electrode 5. The arm 2 and the second cleaning electrode 5 are insulated from each other by the insulator 7. A positive potential is applied to the electroconductive film 6 on the first cleaning electrode 4, and further, a negative potential is applied to the second cleaning electrode 5.

Figure 4:
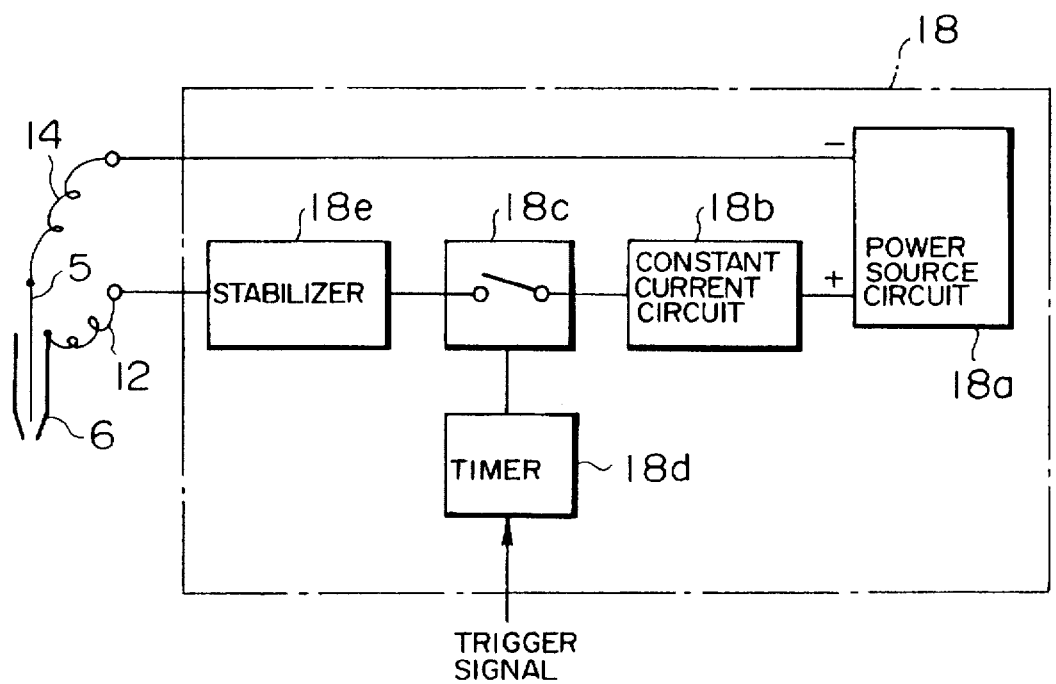
FIG. 4 is a view illustrating a voltage application circuit for the cleaning apparatus shown in FIG. 1.

Further, referring to FIG. 4, explanation will be made of the voltage application circuit 18. A power source circuit 18a for generating a d.c. high voltage is connected, on its negative side, to the second cleaning electrode 5 through the intermediary of the lead wire 14. Further, a constant current circuit 18b connected to the positive side of the power source circuit 18a produces a constant current. A time 18d turns on and off a switching circuit 18c for a predetermined time in response to a trigger signal Tr delivered from an external control device (which is not shown). A stabilizer 18e having a resistor is adapted to stabilize electric discharge. The stabilizer 18e is connected to the electroconductive film 6 on the first cleaning electrode 4 through the intermediary of the lead wire 12 and the like.

Referring to FIG. 2, the arm 2 which is hollow, is formed therein with a suction passage 15 which is communicated with the inside of the first cleaning electrode 4. Referring to FIG. 1, the suction passage 15 in the arm 2 is connected with a vacuum device 17 through the intermediary of a tube 16. Accordingly, when the vacuum device 17 is driven, air is sucked up from the inside of the first cleaning electrode 4 (refer to the arrow in FIG. 2).

Referring to FIG. 1, a positioning part 21 on which a printed circuit board 37 is set and positioned, is provided at its one side surface with a cylinder 22. The printed circuit board 37 is made of GARAEPO, ceramic or the like, and is bonded at its upper surface with a chip 38. As shown in FIG. 2, an electrode 38 is formed on the outer surface of the printed circuit board, and further, an electrode 40 is formed on the chip 39. Referring to FIG. 1, a rod 23 extended from the cylinder 22 carries a mask 24. When the rod 23 is retracted into the cylinder 22, the mask 24 presses and secures the printed circuit board against the positioning part 21.

Figure 3:
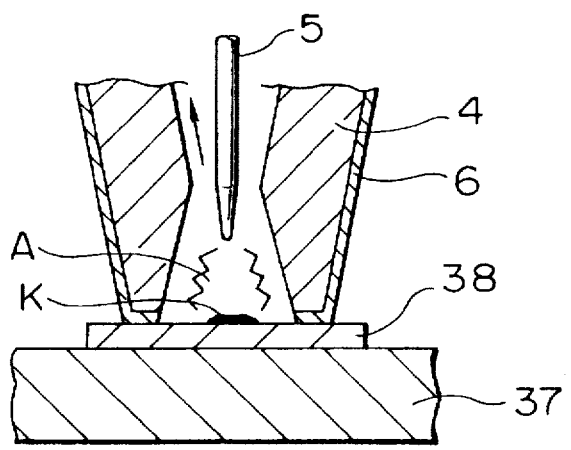
FIG. 3 is a view for explaining the operation of the cleaning apparatus shown in FIG. 1.

The proximal end part of the arm 2 is supported by a frame 25. Further, cam followers 26, 27 are journalled to the rear end part of the frame 25. The cam followers 26, 27 hold a cam 28 therebetween. When the cam is rotated by a motor 29, the frame 25 is vertically swung about a pin 30, and accordingly, the arm 2 is also swung in the same direction so that the cleaning tool 25 is vertically moved (refer to the arrow N). When the cleaning tool 3 is moved downward, the first cleaning electrode 4 is grounded onto the electrode 38 on the printed circuit board 37 or the electrode 40 on the chip 39 and is put into contact therewith (refer to the chain line in FIG. 2, and FIG. 3). That is, the frame 25, the cam followers 26, 27, the cam 28 and the motor 29 constitute means for vertically moving the cleaning tool 3. Referring to FIG. 3, contamination K such as an organic substance sticks to the outer surface of the electrode 38.

Referring to FIG. 1, a table device 31 is composed of an X-axial table 32 and Y-axial table 33 which are stacked one upon another. The frame 25 is journalled to a bearing 36 on the Y-axial table 33 by means of a pin 30. When a motor 34 for driving the X-axial table 32 and a motor 35 for driving the Y-axial table 33 are operated, the frame 25 and the arm 2 are horizontally moved in the X-axis direction and the Y-axial direction so as to locate the cleaning tool 3 at a predetermined cleaning position (just above the electrode 38 or 40). It is noted that the swinging mechanism for the arm 2 and the mechanisms of the table device 31 are the same used in a bonding device disclosed in, for example, Japanese Laid-Open Patent No. 4-291735.

Next, explanation will be made of the operation of the cleaning apparatus for an electrode on a workpiece, which is arranged as mentioned above. Referring to FIG. 1, when the table device 31 is driven, the cleaning tool 3 is horizontally moved in the X-axis direction and in the Y-axis direction, and is then stopped at a predetermined position above the electrode 38 or 40. Then, the motor 29 is driven so as to rotate the cam 28, and accordingly, the arm 2 is downward swung so that the first cleaning electrode 4 is put into contact with the upper surface of the electrode 38.

Accordingly, a positive voltage is applied to the first cleaning electrode 4 while a negative electrode is applied to the second cleaning electrode 5. When the positive voltage is applied to the first cleaning electrode 4, the positive voltage is also applied to the electrode 38 with which the first cleaning electrode makes contact. Accordingly, a potential difference is effected between the second cleaning electrode 5 and the electrode 38 so as to produce electric discharge A which generates heat for removing contamination K. At this time, the vacuum device 17 is also driven so as to suck up the contamination removed from the electrode 38. After completion of the cleaning by the electric discharge, the application of the voltage to the first cleaning electrode 4 and the second cleaning electrode 5 is ceased while the suction by the vacuum device 17 is also stopped, and then the arm 2 is swung upward by rotating the cam 28 together with the cleaning tool 3. Thus, the series of the working steps are completed. At this time, the table device 31 is again driven so as to shift the cleaning tool 3 to a position above a next electrode 38, and thereafter, the above-mentioned working steps are repeated. The electrode 40 on the chip 39 is similarly cleaned as mentioned above. After all electrodes 38, 40 on the chip 39 and the printed circuit board 37 are cleaned, as mentioned above, a wire-bonding process in which the electrodes 40 on the chips 39 and the electrodes 38 of the printed circuit board 37 are all connected together with wires, is carried out by means of a wire-bonding device.

With the use of the cleaning apparatus for an electrode on a workpiece, the following excellent technical effects and advantages can be obtained. That is, only the upper surface of the electrodes 38, 40 can be spottedly and effectively cleaned, thereby making it possible to prevent the outer surfaces of the printed circuit board 37 and the chips 39, other than the electrodes 38, 40, from being damaged. Since the structure of a substantial part of the above-mentioned cleaning apparatus is the same as that of a conventional wire-bonding apparatus, it is sufficient to set the cleaning unit 1 and the suction device 17, instead of bonding tools such as a horn and a capillary tool, in the wire-bonding apparatus, and accordingly, the cleaning apparatus according to the present invention can be manufactured in a relatively simple manner. It is also possible to use a control program software for the table device 31 in order to move the cleaning tool 33 to a predetermined position. Further, if the electrode cleaning apparatus and the wire-bonding apparatus are installed in cooperation with each other, a wire-bonding process can be carried out at once after the electrodes 38, 40 are cleaned, and accordingly, the time between the cleaning and the wire-bonding can be shortened, thereby making it possible to prevent recontamination of the outer surfaces of the electrodes which has been cleaned.

It is noted that the above-mentioned embodiment can be variously modified. Although it has been explained that the cleaning tool 3 is moved in the X-axis and X-axis directions, relative to a workpiece such as the circuit board 37 or the chip 39, the positioning part 21 can be moved so as to move the workpiece such as the printed circuit board 37 or the chip 39 in the X-axis and X-axis direction, relative to the cleaning electrode 3. Alternatively, the cleaning electrode 3 can be moved in the X-axis direction and the workpiece such as the printed circuit board 37 or the chip 39 is moved in the X-axis direction. That is, it is essential to move the cleaning electrode 3, relative to the workpiece such as the printed circuit board 37 or the chip 39, so as to locate the same at a position just above a predetermined electrode 38, 40, 41. It has been also explained that the contamination K removed from the electrodes 38, 40, 41 is sucked into the stream of air sucked up by the vacuum device 17. It is also possible to jet gas such as reducing gas or inert gas so as to prevent the electrode from being oxidized by heat produced by the electric discharge. The cleaning apparatus can be used not only for cleaning an electrode prior to wire-bonding, but also for cleaning an electrode on a printed circuit board, a chip or a semiconductor prior to wire-bonding of a bump (protrusion electrode) to the electrode.

Figure 5:
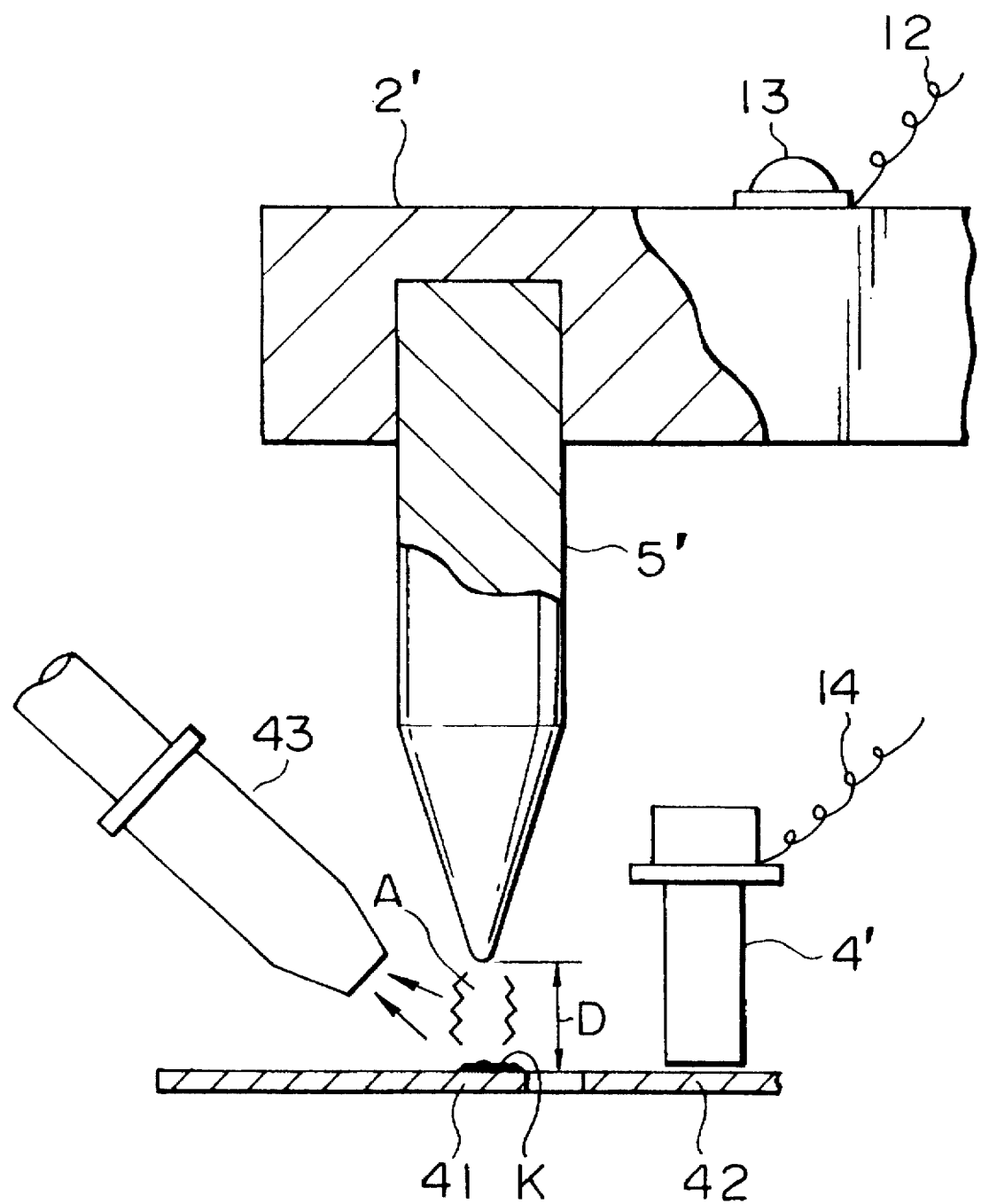
FIG. 5 is a partial sectional view illustrating an apparatus for cleaning an electrode on a workpiece in a second embodiment of the present invention.

Explanation will be hereinbelow made of an apparatus for cleaning an electrode on a workpiece, in a second embodiment of the present invention with reference to FIG. 5 which is a partially sectioned view.

A second cleaning electrode 5' is carried by the front end part of an arm 2', and is applied thereto with a negative voltage through a lead wire 12. Further, a first electrode 4' which is separated from the second cleaning electrode 5' is put into contact with a lead frame 42 formed of an electroconductive metal sheet, and accordingly, is applied with a positive voltage through the lead wire 14. A nozzle 43 connected to a vacuum device 17 sucks up air around the upper surface of an electrode 41 on the lead frame 42. The structures of the other parts of the cleaning apparatus, such as a table device 31, are the same as those explained in the first embodiment.

With this arrangement, the second cleaning electrode 41 is located at a position just above the electrode 41 by driving the table device 31. A positive voltage and a negative voltage are applied to the first cleaning electrode 4' and the second cleaning electrode 5', respectively, so as to produce electric discharge A between the second cleaning electrode 5' and the electrode 41 for removing contamination K by heat generated by the electric discharge, and then the contamination K is sucked into the nozzle 43. Further, by adjusting the height of the second cleaning electrode 5' so as to adjust the distance D to the electrode 41, an optimum electric discharge distance can be obtained.

Next, explanation will be hereinbelow made of a cleaning device in a third embodiment of the present invention with reference to FIG. 6 and FIGS. 7a to 7c.

It is noted that like reference numerals are used to denote like parts to those explained in the first embodiment.

Figure 6:
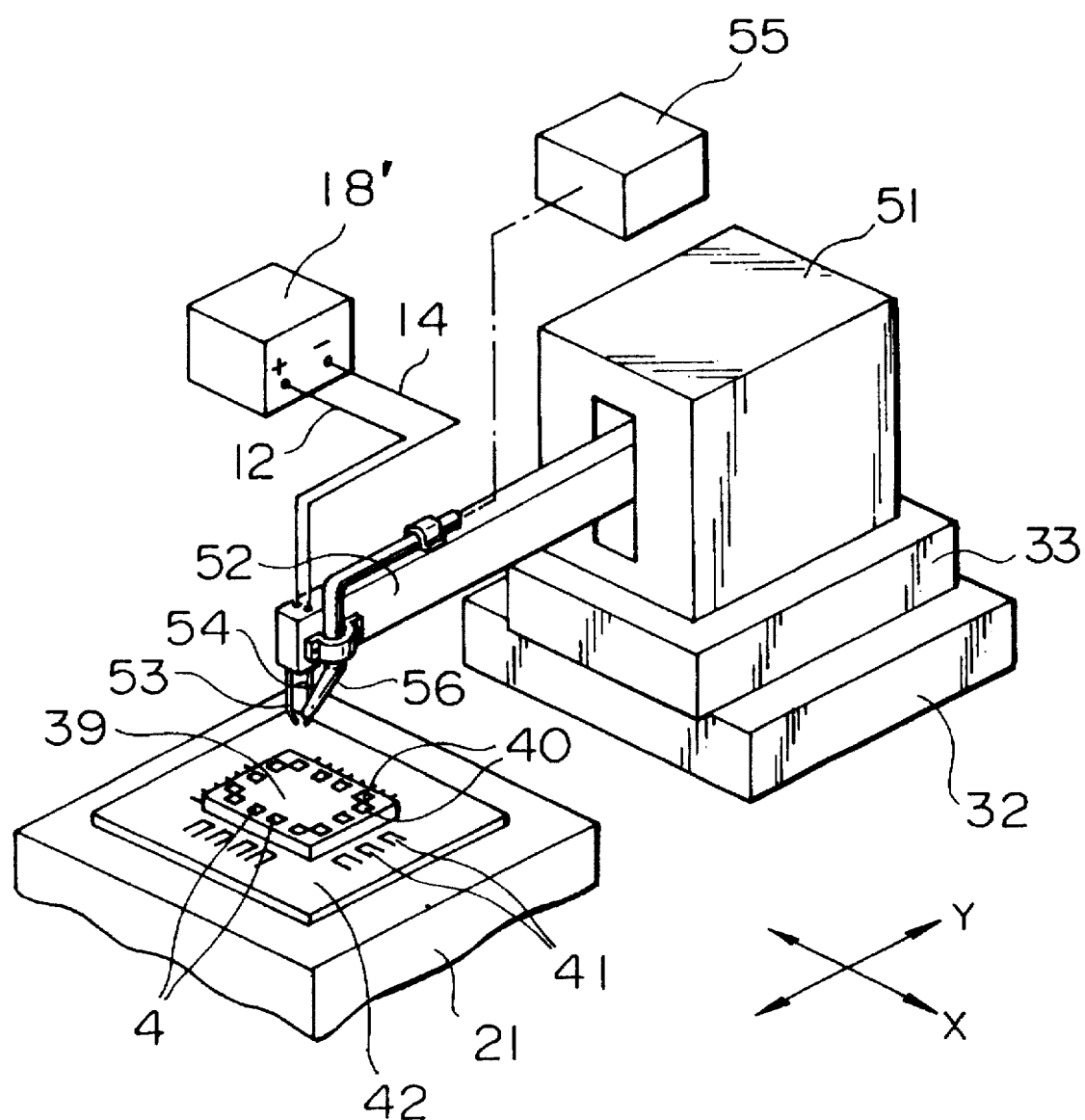
FIG. 6 is a perspective view illustrating an apparatus for cleaning an electrode on a workpiece in a third embodiment of the present invention.

Referring to FIG. 6, a positioning part 21 is adapted to position a lead frame 42 as a printed circuit board on which a chip 39 is mounted. At a later process step, wire-bonding is carried out between an electrode 40 on the chip 39 and an inner lead 41 on the lead frame 42.

A drive unit 51 for vertically swinging an arm 52 is constituted by components similar to components such as the motor 29, the cam 28 and the frame 25 in the first embodiment (refer to FIG. 1). This drive unit 51 is attached to an Y-axial table 33 mounted on an X-axial table 32. A pair of needle-like electrodes 53, 54 are attached to the front end part of the arm 52, being downwardly directed. A positive electrode of a voltage application circuit 18 is electrically connected to one of these electrodes 53, 54 while a negative electrode thereof is connected to the other one of the electrodes 53, 54 through the intermediary of wiring. It is noted that the front ends of the cleaning electrodes 53 54 are separated from each other by a distance D with which electric discharge can be made. With this arrangement, when the arm 52 is swung downward while the voltage application circuit 18 is energized, electric discharge can be carried out between the lower ends of the pair of the electrode 53, 54 (for example, at about 2,000 V, 30 mA and 3 msec). Further, a gas supply device 55 for jetting inert gas such as nitrogen gas, or reducing gas, which is a mixture of nitrogen gas and hydrogen gas, is connected thereto with a nozzle 56 attached to the front end part of the arm 52 and facing at its front part the space between the front end parts of the pair of cleaning electrodes 53, 54. With this arrangement, when the gas supply device 55 is energized, the inert gas or the reducing gas is jetted from the nozzle 56 so as to blow off contamination K around the pair of cleaning electrodes 53, 54 and to create an inert or reducing atmosphere.

Next, explanation will be hereinbelow made of a cleaning method in this embodiment with reference to FIGS. 7a to 7c.

Figure 7A:
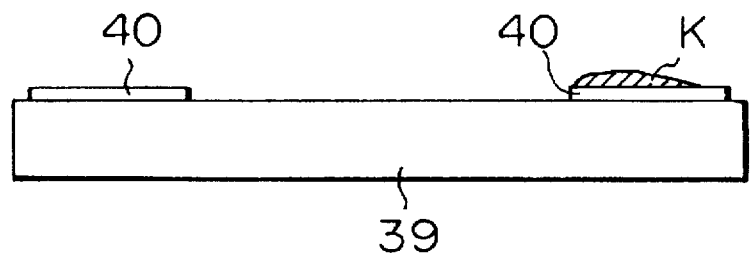
FIGS. 7a to 7c are views for explaining the operation of the cleaning apparatus shown in FIG. 6.

Before executing the cleaning method, the pair of cleaning electrodes are moved to a position above the electrode 40 on which contamination K sticks as shown in FIG. 7a, by driving the X-axial table and the Y-axial table 40, and then the arm 52 is lowered so as to approach the electrode 40 by operating the drive unit 33.

Figure 7B:
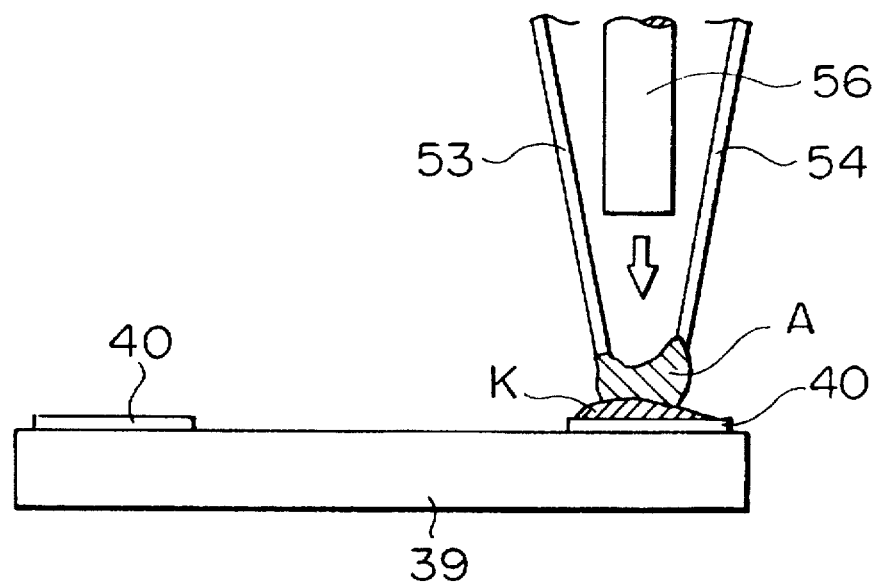
Figure 7C:
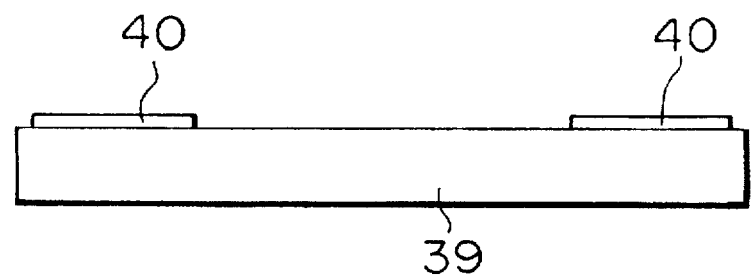

Further, as shown in FIG. 7b, the gas supply device 55 is energized so as to jet and direct inert gas or reducing gas to the electrode 40 from the nozzle 56 while the voltage application circuit 18 is energized to generate electric discharge A between the pair of cleaning electrodes 53, 54. Accordingly, the contamination K is removed from the electrode 50 by heat generated by the electric discharge A, as shown in Fig. 7c. After completion of the cleaning for the electrode 40, the drive unit 51, the Y-axial table 33 and the X-axial table 32 are driven so as to cause the pair of cleaning electrodes 53, 54 to approach a position just above a next electrode 40 or a next inner lead 41. Then the electric discharge is again generated so as to repeat the above-mentioned working steps. In the case of cleaning the inner lead 41, a part where a wire is connected to the inner lead 41 is alone locally cleaned.

With the arrangement of the third embodiment, since no voltage is applied to an object to be cleaned such as the electrode 40, the inner lead or the like, there is no risk of damage to chip 39 by an applied voltage.

Further, a suction device for sucking up the ambient air through the nozzle 56 can be connected to the nozzle 52, instead of the gas supply device 55, in order to suck up the contamination K removed from the electrode K, through the nozzle 56.

Figure 8:
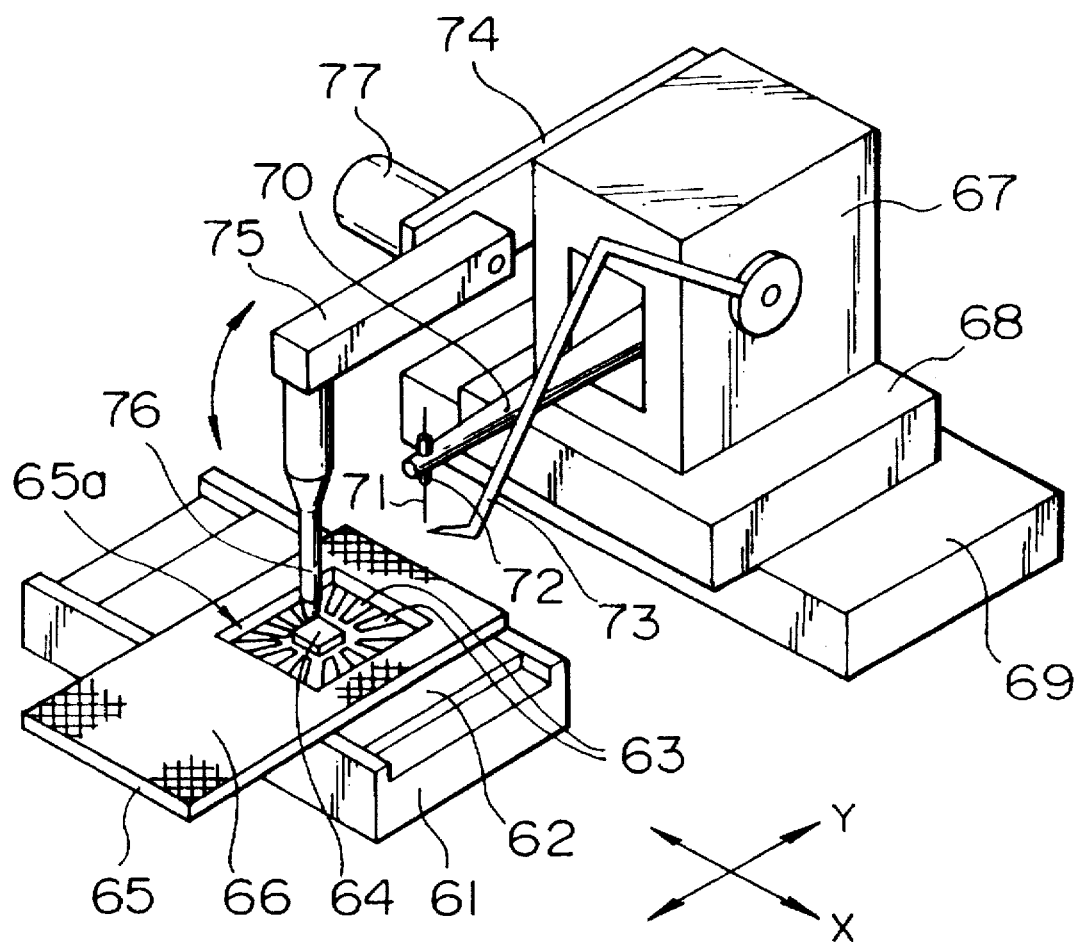
FIG. 8 is a perspective view illustrating a wire-bonding apparatus in a first embodiment of the present invention.

Next, explanation will be hereinbelow made of a wire-bonding apparatus in an embodiment of the present invention with reference to FIGS. 8 to 10.

Referring to the figures, a conveyer rail 61 conveys or positions a printed circuit board 61 such as a lead frame or a thick film ceramic substrate in the X-axial axis direction, and an electrode 63 is formed on the printed circuit board 62, surrounding a chip 64 mounted on the printed circuit board 62. Contamination K (refer to FIG. 10) possibly sticks on the outer surface of the electrode 63 during a curing process for securing the chip 64 on the printed circuit board 64 with the use of adhesive.

A retaining member 65 presses downward the printed circuit board 61 on the conveyer rail 61, and is made of electroconductive materials such as stainless steel at least in a part which makes contact with the electrode 63 on the printed circuit board 62. Further, the retaining member 62 is formed therein with an opening 65a for exposing the chip 64 or the electrode 63, as shown. Further, the retaining member is coated over its surface with an insulating coating 66 so as to prevent electric discharge from directly affecting the retaining member 65 when the electric discharge is applied to the electrode 63.

A drive unit 67 is attached on an Y-axial table 68 on an X-axial table 69, and incorporates a drive mechanism for vertically swinging an arm 70 so as to vertically move a capillary tool attached to the front end of the arm 70, relative to the printed circuit board 62 or the chip 64. A torch electrode 73 is located at its distal end part, laterally of the capillary tool 72, having its proximal end part which is fixed to a side surface of the drive unit 67. This torch electrode 72 produces electric discharge between itself and the lower end part of a wire 71 led through the capillary tool 72 so as to form a ball at the lower end of the wire 71. A support rod 74 extending from the drive unit 67 to the conveyer rail 61 is attached at its front end part with a swing arm 75 adapted to be swung in the direction of the arrow shown in FIG. 8 by means of a rotary cylinder 77. A needle-like cleaning electrode 77 is attached to the distal end part of the swing arm 75, being directed downward. This needle-like electrode 77 can be moved at its lower end to and away from the electrode 63 when the swing arm 75 is swung.

Next, explanation will be hereinbelow made of an electric system for the wire-bonding apparatus in this embodiment with reference to FIG. 9.

A voltage application circuit 18 is the same as that for the cleaning apparatus in the first embodiment so that it is denoted by the same reference numeral in order to abbreviate the explanation thereof.

A control part 78 for controlling all parts of the apparatus delivers a trigger signal Tr to a timer 18d and a change-over signal C to a change-over switch 79 which will be explained later.

Next, explanation will be made of the change-over switch 79 which receives the change-over signal C from the control part 78 so as to associatingly change over between the negative side and the positive side of a dual system 79, and which has a first input terminal 80 connected to a first terminal A1 (negative side) of the voltage application circuit 18, and a second input terminal 81 which is connected to a second terminal A2 (positive side) of the same. A negative side first output terminal 82 is connected to the cleaning apparatus 76, and a positive side second output terminal 83 is connected to the torch electrode 73. Further, a positive side third terminal 84 thereof is connected to the retaining member 65 (that is an electrode 63), and a fourth output terminal 85 thereof is connected to a wire 71.

Figure 9:
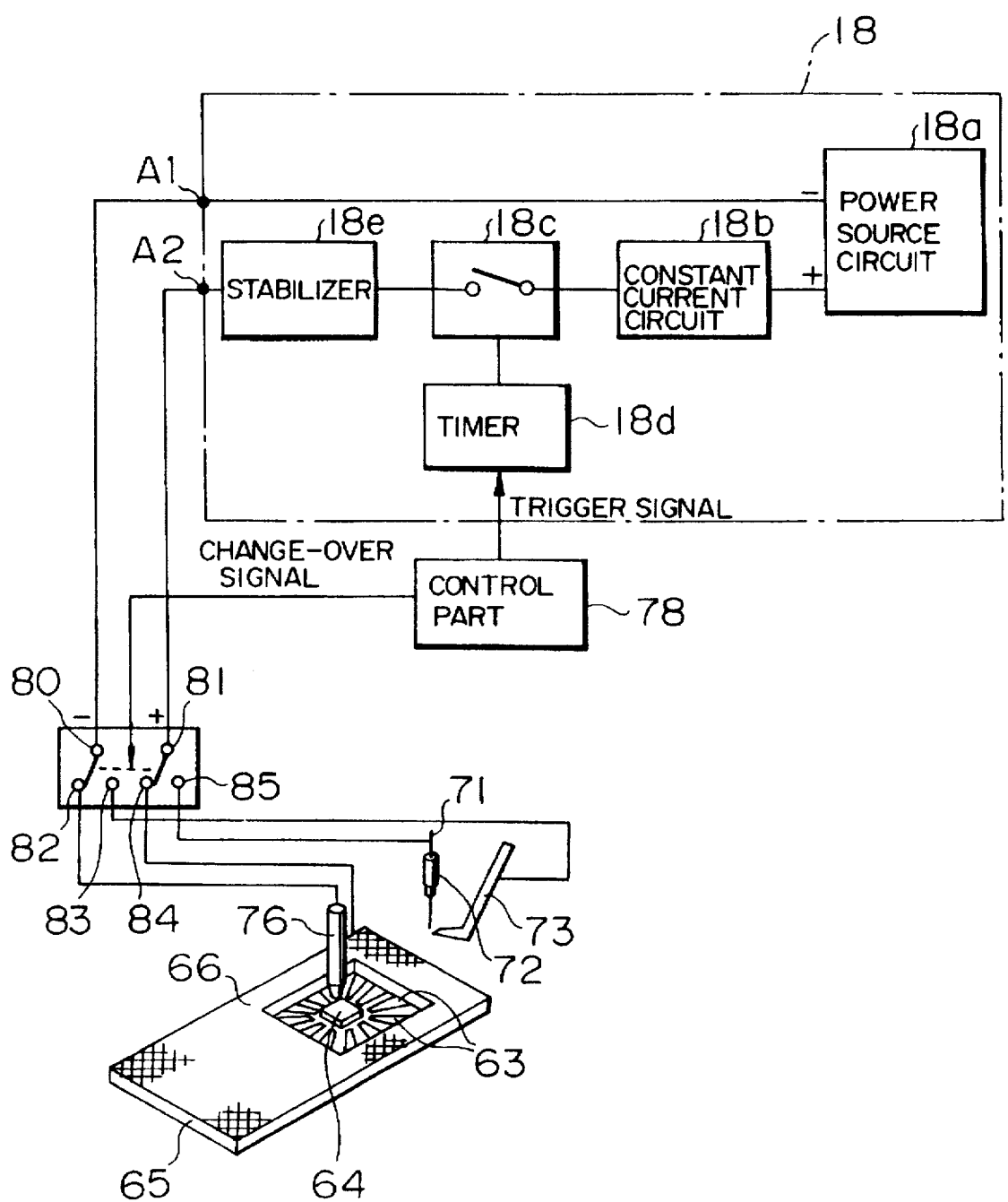
FIG. 9 is a block diagram for explaining the wire-bonding apparatus shown in FIG. 8.
Figure 10:
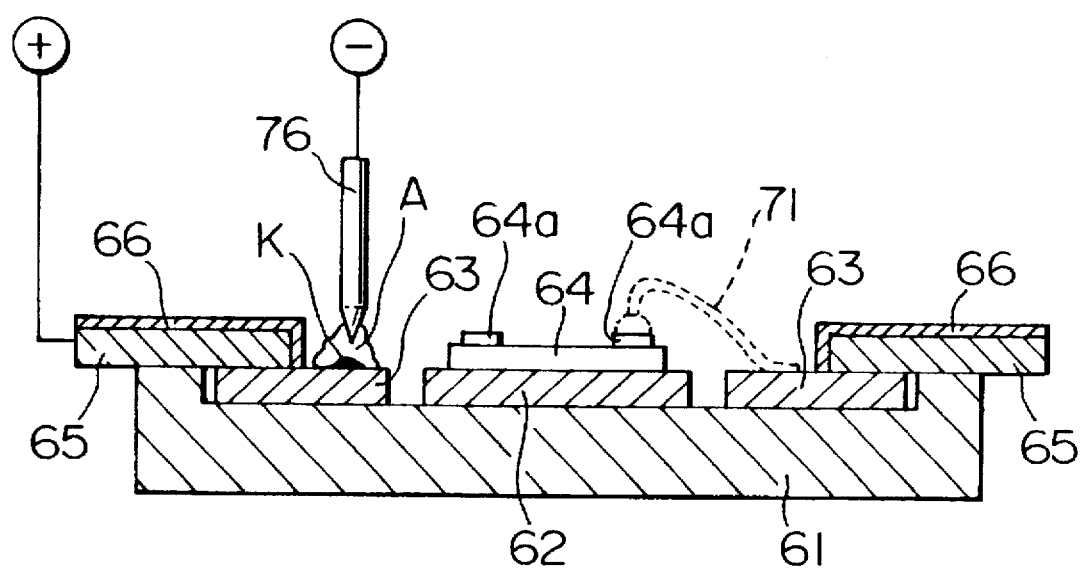
FIG. 10 is a view for explaining the operation of the wire-bonding apparatus shown in FIG. 8.

With this arrangement, after the change-over switch 79 is set as shown in FIG. 9 and the cleaning electrode 76 is moved to approach the electrode 63, when the voltage application circuit 18 is energized, electric discharge A is produced between the electrode 63 and the cleaning electrode 76 so as to clean the electrode 63 with the use of heat from the electric discharge A. Further, the control part 78 turns over the change-over switch 79, and after the torch electrode 73 approaches the lower end part of the wire 71, when the voltage application circuit 18 is energized, electric discharge is produced between the wire 71 and the torch electrode 73 so as to form a ball at the lower end of the wire 71. In this embodiment, the formation of the ball and the cleaning are both used, and accordingly, it is possible to easily add a cleaning function for the electrode 63 to a conventional wire-bonding apparatus. It is noted that the control part 78 adjusts the timing of delivering the trigger signal Tr and the change-over signal C.

Next, explanation will be hereinbelow made of the operation of the wire-bonding apparatus in this embodiment with reference to FIG. 10. After positioning the printed circuit board, the upper surface of the printed circuit board is pressed by the retaining member 65. Then, the change-over switch 79 is set as shown in FIG. 9, and the cleaning electrode 76 is moved to a position just above a bonding position where the wire is connected to the electrode 63. Further, the control part 63 delivers the trigger signal Tr so as to energize a timer 18d for a predetermined time in order to turn on a switching circuit 18c, and accordingly, electric discharge A is produced between the electrode 63 and the cleaning electrode 76 so as to remove contamination K from the bonding position. These working steps are repeated for all electrodes 63 on the printed circuit board while the X- and Y-axis tables 68, 69 are driven so that the cleaning process is completed. Then, the cleaning electrode 76 is elevated, and then the change-over switch 79 is turned over from the position shown in FIG. 9. Further, the lower end part of the wire 71 is moved to the torch electrode 73, and thereafter, the control part 78 delivers the trigger signal Tr in order to produce electric discharge between the lower end part of the wire 71 and the torch electrode 73, and accordingly, a ball is formed at the lower end of the wire 71. Thereafter, the capillary tool 73 is elevated so as to join the ball to an electrode 64a on the chip 63, and thereafter, the wire 71 is paid off by a predetermined length so as to be joined to a bonding position on the cleaned electrode 63.

The above-mentioned working steps are repeated in order to carry out wire-bonding for all remaining electrodes 63.

It is noted that the wire-bonding apparatus in this embodiment can be also used as a bump forming apparatus for forming a bump on an electrode on a printed circuit board, a chip, a semiconductor wafer or the like. Also in this case, the electrode is cleaned prior to the formation of the bump.

With the use of the apparatus for and the method of cleaning an electrode on a workpiece, according to the present invention, only contamination on an electrode can be locally removed with the use of heat generated from the electric discharge, and accordingly, it is possible to prevent the outer surface of the electrode other than the electrode from being damaged. Further, the substantial part of the cleaning apparatus according to the present invention, has the same structure as that of the existing wire-bonding apparatus, and accordingly, the cleaning apparatus according to the present invention can be formed in a relatively simple way.

With the use of the wire bonding apparatus and the wire-bonding method, according to the present invention in which a wire is connected to an electrode on a workpiece just after removal of contamination, the wire can be surely connected to the electrode on the workpiece. Further, a substantial part of a conventional wire-bonding apparatus and a voltage application circuit therefor can be used for the wire-bonding apparatus according to the present invention, and accordingly, a wire-bonding apparatus incorporating a cleaning function can be easily manufactured.

What is claimed is:

1. A wire-bonding apparatus comprising:

cleaning means for producing an electric discharge on an electrode on a workpiece so as to remove contamination on said electrode on said workpiece by use of said electric discharge; and wire-bonding means for connecting a wire to said cleaned electrode on said workpiece.

2. A wire-bonding apparatus as set forth in claim 1, wherein said cleaning means comprises:

an electroconductive member making contact with said electrode on said workpiece;

a cleaning electrode adapted to approach said electrode on said workpiece; and a voltage application circuit for applying a voltage between said cleaning electrode and said electroconductive member so as to produce said electric discharge between said electrode on said workpiece and said cleaning electrode when said cleaning electrode approaches said electrode on said workpiece.

3. A wire-bonding method comprising the steps of:

producing an electric discharge on an electrode on a workpiece so as to remove contamination on said electrode on said workpiece by use of said electric discharge; and connecting a wire to said electrode, from which said contamination is removed, on said workpiece.

* * * * *